United States Patent [19]

Cook et al.

[11] Patent Number: 4,799,007
[45] Date of Patent: Jan. 17, 1989

[54] BENDABLE PIN BOARD TEST FIXTURE

[75] Inventors: Stephen J. Cook; Michael L. Bullock, both of Loveland, Colo.

[73] Assignee: Hewlett-Packard Company, Palo Alto, Calif.

[21] Appl. No.: 73,876

[22] Filed: Jul. 14, 1987

Related U.S. Application Data

[63] Continuation of Ser. No. 794,198, Nov. 1, 1985, abandoned.

[51] Int. Cl.$^4$ .............................................. G01R 31/02
[52] U.S. Cl. ........................... 324/158 F; 324/73 PC; 324/158 P
[58] Field of Search ........... 324/158 F, 158 P, 73 PC, 324/72.5; 439/476, 296, 658, 507, 514–515

[56] References Cited

U.S. PATENT DOCUMENTS 4,017,793 4/1977 Haines ..................... 324/158 F X
4,357,062 11/1982 Everett ..................... 339/75 M X

FOREIGN PATENT DOCUMENTS 2933862 3/1981 Fed. Rep. of Germany ... 324/73 PC

Primary Examiner—Reinhard J. Eisenzopf
Assistant Examiner—Vinh P. Nguyen
Attorney, Agent, or Firm—Bloor Redding, Jr.; S. A. Kassatly

[57] ABSTRACT

An apparatus is described for interfacing an automatic board test system to an electronic circuit card. This interface permits short and reliable connections between the test system and electronic components located on the circuit card for the electronic signals which test these components. This apparatus works equally well with vacuum actuated and mechanically actuated systems.

15 Claims, 2 Drawing Sheets

BENDABLE PIN BOARD TEST FIXTURE

CROSS REFERENCE TO RELATED APPLICATION

This application is a continuation of application Ser. No. 794,198 filed Nov. 1, 1985, now abandoned.

BACKGROUND

This invention relates to the field of art pertaining to board test fixtures and other mechanical interfaces for electrically interconnecting electronic circuit cards and the like to electrical switching systems.

A board test system consists of numerous electronic sources and detectors which are connected through an electric switch, or scanner, to a plurality of contact points referred to as scanner pins. A board test fixture then provides an interface between these scanner pins and the electronic components located on an electronic circuit card. Since the electronic signals which are used to determine whether the electronic component is operating properly must pass through the board test fixture both on their way to and from the electronic component, the board test fixture must maintain the signal quality of these signals to ensure that the electronic component is not incorrectly diagnosed as operating properly or improperly.

In order to insure maximum signal quality, the length of the signal path between the scanner and the electronic circuit card should be kept as short as possible. This normally dictates a vertical configuration with the board test fixture sitting directly on top of the scanner and the electronic card directly on the fixture. However, any board test fixture must be easy to assemble and maintain in order to be cost effective and many prior art vertical configuration test fixtures have sacrificed assembly and maintainability to obtain short lead length The ability to automate assembly of the fixture is also an important feature.

Various prior art solutions have attempted to address these requirements. A first prior art solution uses a stiff probe pin to conduct the electronic signal directly from a spring loaded scanner pin to the electronic component under test. The probe pin passes through a first plate having a hole for each scanner pin and through a second plate have holes drilled according to the location of the electronic components on the card. This probe pin may be vertical if the component is located directly over the scanner pin, or the probe pin may be at an angle. At an angle, the probe pin may miss the component which it is trying to contact, or may make a high resistance contact, both being undesirable.

A second prior art solution replaces the stiff probe pin with a flexible probe pin. This permits the holes in both the first and second plate to be at right angles to the scanner pins and electronic components assuring a low resistance contact with the electronic component.

Both the first and second prior art solutions are impractical because they require a large number of scanner pins in order for a scanner pin to be located sufficiently close to the component to be able to use a straight or slightly bent pin. More scanner pins mean additional expensive pin electronics. In order to reduce the number of scanner pins, the fixturing method should permit signals from the scanner pins to be routed, or translated, to probe pins located at a different x and y axis positions from the scanner pins with respect to the plane of the probe plate. For incircuit and functional testing, the fixturing method must permit translation between the component location and the scanner pin location.

A third prior art solution permits translation at the expense of long connecting wires. The fixture again has two plates, the first plate drilled according to the locations of the electronic components on the card and the second plate with holes positioned above the scanner pins. A spring loaded probe with a wire wrap post is mounted in the first plate making electrical contact with the electronic components on the card. An interconnect pin with a wire wrap post is mounted in the second plate making electrical contact with the scanner pin. A wire is then wire wrapped between the probe pin and the interconnect pin to complete the electrical connection. This wire is typically quite long to enable the fixture to be opened for easy building and maintenance. Because the wire is long, the electrical performance of the third solution is inferior. A fourth prior art solution is similar to the third prior art solution but uses short wires between the probe pin and the interconnect pin. However, in order to use short wires, the second plate of the fourth solution is divided into interconnect strips. The interconnect strips are arranged in rows below the probe plate. Electrical connections are made one row at a time between the probe pins and the interconnect pins located in these strips. Starting at one end and after each row of connections is made, each strip is sequentially mounted across the bottom of the fixture. The fourth prior art solution, although offering good electrical performance, is difficult to wire, especially if there is a large number of x and y axis translations. This solution is impossible to automate and service is very difficult.

The fifth and final prior art solution is referred to as the "basic matrix". This solution uses a printed circuit board to perform the x and y axis translation. The probes which contact the electronic components are mounted directly to the top of the printed circuit board and the scanner pins contact the bottom of the printed circuit board to complete the connection. This solution is expensive requiring a custom printed circuit board for each fixture and special probes. Furthermore, this solution causes scanner pins located directly under probes to be made unusable, a very undesirable feature.

A need exists for a low cost, easy to build test fixture for which assembly is automatable. The test fixture should minimize the loss of scanner pins and provide for translation in the x and y axis directions between probe and scanner pin.

SUMMARY

In accordance with the preferred embodiment of the present invention, an apparatus is described for interfacing an automatic board test system to an electronic circuit card. This interface permits reliable electrical connections between the test system and electronic components located on the circuit card. The apparatus differs from the prior art in that the connections maximize the quality of the connection to the test system while permitting easy and automatic assembly of the test fixture. This apparatus works equally well with both vacuum actuated and mechanically actuated systems.

The present invention is superior to the prior art in several ways. First, the apparatus is a vertical fixturing scheme which minimizes the interconnection lead length. Second, the apparatus is easy to assemble and the assembly may be automated to further reduce the cost. Third, the apparatus avoids where possible making the interconnection points to the test system unusable. Finally, the apparatus does not require the electronic components to be located on a grid of any sort; the electronic components may be located anywhere on the card.

DESCRIPTION OF PREFERRED EMBODIMENT

Figure 1:
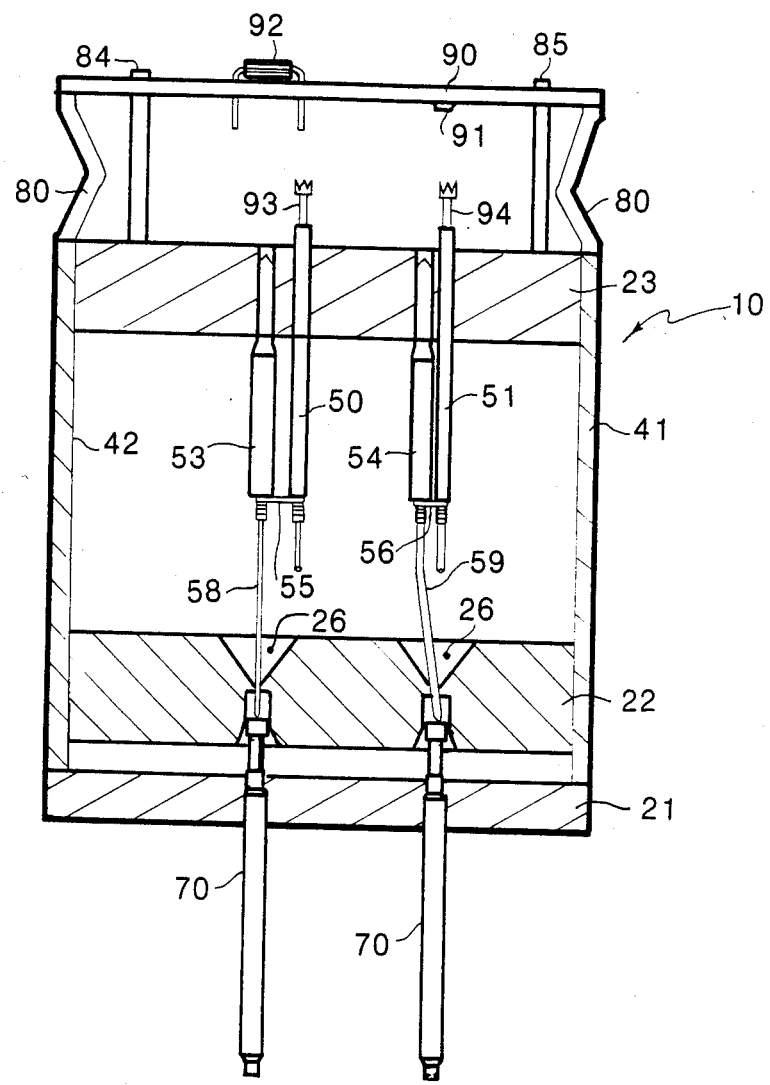
FIG. 1 is a fragmentary elevational view of the preferred embodiment of the present invention in a first position with an electronic circuit card.

FIG. 1 is a fragmentary elevational view of the preferred embodiment of the present invention in a first position with an electronic circuit card. The test fixture comprises an alignment plate 22, probe plate 23, two probe assemblies 50 and 51, two interconnecting pins 53 and 54, interconnect wire 55 and 56, walls 41 and 42, alignment pins 84 and 85, and vacuum seal 80. The electronic circuit card to be tested consists of a printed circuit board 90, component 92, and printed circuit trace 91. The printed circuit board 90 has two tooling holes which may be used for alignment. A vacuum chamber is formed by the board 90, vacuum seal 80, and probe plate 23. A vacuum manifold, not shown, is attached over a hole in the probe plate to draw the air from the vacuum chamber. Vacuum is used in the preferred embodiment to force the electronic circuit card against the probe assembly, although mechanical means may also be used. The test fixture is mounted on the test system scanner. The scanner consists of a plate 21 with scanner pins 70. The construction of scanners is well known in the prior art as are various mounting and locking mechanism for holding the test fixture to the scanner. The present invention is capable of operating with a wide variety of scanners and mounting and locking mechanisms.

The probe assembly typically consists of a probe socket which is mounted into the hole in the probe plate and a probe mechanism having probe tip 94 which is inserted into the probe socket. The probe mechanism may be replaced as the probe tip 94 wears out. The probe socket consists of a tube which accepts the probe mechanism and a square wire wrap post. The probe mechanism consists of a probe tip 94 and a spring to bias the probe tip 94 to its maximum extended position in a housing which fits in the probe socket. Both probe sockets and probe mechanisms, including a variety of probe tips, are well known in the art.

The interconnecting pin 53 or 54 consists of insulated body about the same length as the probe assembly and a wire wrap post 58 or 59 which is considerably longer than the wire wrap post of the probe assembly 50 or 51. In the preferred embodiment of the present invention, the wire wrap post 58 or 59 of the interconnecting pin is approximately one inch long.

The probe plate 23 is constructed from a strong insulating material. In the preferred embodiment of the present invention, a sheet of plastic approximately one-half of an inch thick is used as the probe plate. In the preferred embodiment of the present invention, the plate 23 has a manifold hole which is not shown. The plate 23 is then drilled for the probe assemblies 50 and 51, interconnecting pins 53 and 54 and alignment pins 84 and 85. The locations of the probe assemblies 50 and 51 and the alignment pins 84 and 85 are determined by the locations of the components and traces on the electronic circuit card 90. These locations are often available from CAD/CAM systems as points. This permits a fixture builder to select the points from the CAD/CAM files for the electronic circuit card to be tested and to have the probe plate automatically drilled at these points. Automatic drilling is considerably less expensive than manual drilling. The location of the interconnecting pins is determined, with one important exception, from the location of the scanner pins. The scanner pins are on a fixed grid which may also be automatically drilled. The exception occurs when a probe assembly is located directly over a scanner pin as shown by probe assembly 51 in FIG. 1. For these cases, the hole for interconnecting pin is drilled off to one side. The maximum distance to offset the hole for the interconnecting pin is determined by the length of the interconnecting pin and the tolerances of the scanner pins and fixture For the preferred embodiment of the present invention, a 0.100 of an inch is used for the offset. The holes for the interconnecting pins do not need to pass completely through the probe plate, although in the preferred embodiment they do for convenience of drilling. Drilling the holes for the interconnecting pins may also be computerized by the CAD/CAM system since the system knows the location of both the components and the scanner grid.

After the probe plate is drilled, the alignment pins, the probe assemblies and the interconnecting pins are installed by pressing the pin or assembly into the probe plate, a process which lends itself to automation. The probe plate must then be wired. The x and y axis translation features, as well as the multiple connection capabilities of the fixture are provided by wiring each probe assembly to one or more interconnecting pins. In the preferred embodiment of the present invention, the method of wiring is by wire wrapping. Wire wrapping is fast and lends itself to automation. FIG. 1 illustrates the interconnect wires 55 and 56 used for connecting the interconnecting pin to the probe assembly in the preferred embodiment of the present invention.

After the probe plate has been wired, the fixture is assembled by connecting the probe plate 23 to the alignment plate 22. The primary requirement is to position the alignment plate 22 at a constant fixed distance, from the probe plate 23. In the preferred embodiment of the present invention, the alignment plate is located approximately an one and one-eighth inches plus or minus one sixteenth of an inch, from the probe plate. The preferred embodiment of the present invention uses a wall 41 and 42 to position the alignment plate with respect to the probe plate. Walls offer the added advantage of keeping dirt out, reducing the possibility of accidental damage to the fixture, and adding stiffness to the probe plate to reduce deflection. Alternate methods, including posts, may be used.

The alignment plate 22 has holes 26 on a grid which corresponds to the location of the scanner pins 70. The wire wrap posts of the interconnecting pins 58 pass through these holes in the alignment plate to make contact with the scanner pins. The holes 26 in the alignment plate 22 are bored out to a tapered shape to assist in assembly. These tapered holes 26 are especially important in the special case described above where a probe assembly lies directly above the scanner pin. In this case as shown in FIG. 1, the wire wrap post 59 of the interconnecting pin 54 which has been offset to on side of probe pin 51 is bent as it is passes through the the hole 26 in the alignment plate 22. The tapered bore of the hole 26 makes assembly of the offset interconnecting pins possible and permits easy disassembly for maintenance and repair.

Accurate alignment of the test fixture is essential for reliable operation. Alignment for the printed circuit board 90 to probe plate 23 is maintained by the alignment pins 84 and 85. Two or more alignment pins may be used depending on the size of the board. Alignment between the probe plate 23 and the alignment plate 22 is not critical since the wire wrap posts of the interconnecting pins are free to bend although it does determine the required length of the wire wrap post of the interconnecting pin. The alignment between the alignment plate 22 and the scanner 21 is controlled through the mounting and locking hardware well known in the prior art.

The method of operation of the test fixture is as follows. The printed circuit board is placed on the fixture with the alignment pins 84 and 85 of the test fixture passing through the tooling holes in the printed circuit board 90. The component 92 and trace 91 of the electronic circuit card must now be brought into contact with the probe tips 93 and 94. This may be achieved in several ways including vacuum and mechanical actuating means. The Preferred embodiment of the present invention uses a vacuum actuating means. Air is removed from the vacuum chamber created between the electronic circuit card and the probe plate 23. A seal 80 is used to maximize the force and reduce noise. As the electronic circuit card is drawn toward the probe plate, the probe tips 93 and 94 of the spring loaded probe assemblies 50 and 51 push against the ends of the component 92 and the trace 91 making a good low resistance contact.

Figure 2:
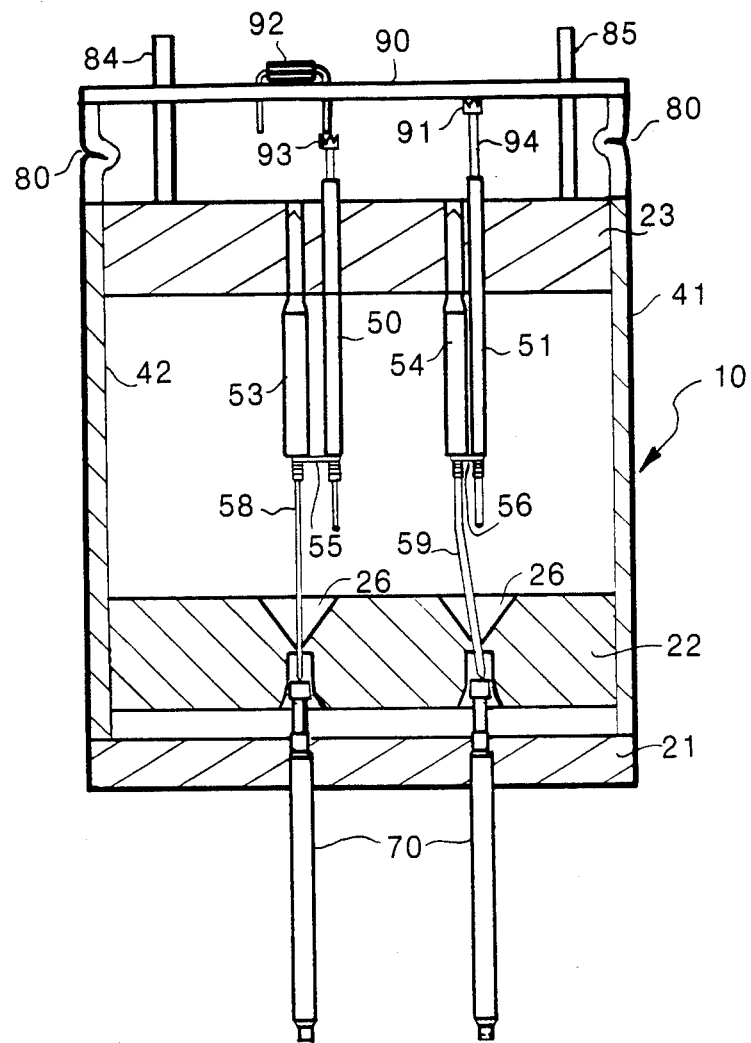
FIG. 2 is a fragmentary elevational view of the preferred embodiment of the present invention in a second position with the electronic circuit card.

FIG. 2 is a fragmentary elevational view of the preferred embodiment of the present invention in a second position with the electronic circuit card. FIG. 2 illustrates the printed circuit board with the vacuum applied in position for testing. When the vacuum is released the card returns to the position in FIG. 1 and may be easily removed and the next card to test installed.

Mechanical means may also be used for driving the electronic circuit card against the probe tips. This may be accomplished, for example, by placing a weight on top of the board. The present invention works well with any method of forcing the electronic circuit card against the probe tips.

We claim:

1. A board test fixture for interfacing electronic signals from a card having electronic devices mounted thereon at fixed predetermined locations, to test system interface having electrical contacts at fixed predetermined locations, the electronic devices including ends to be matched with, and electrically connected to the contacts, regardless of the disposition or alignment of the contacts relative to the ends of the electronic devices to be tested, the fixture comprising:
   a perforate probe plate disposed intermediate the card and the test system interface and having a first plurality of spaced-apart holes at fixed predetermined locations thereon, said first plurality of holes being aligned in substantial registration with the ends of the electronic devices on the card;
   said probe plate further including a second plurality of spaced-apart holes at fixed predetermined locations thereon, said second plurality of holes being aligned in substantial registration with the electrical contacts of the test system interface;
   said probe plate additionally including a third plurality of spaced-apart holes at fixed predetermined locations thereon, said third plurality of holes being axially offset relative to the electrical contacts of the test system interface;
   each one of said second and third plurality of holes being generally disposed adjacent to, and substantially grouped with a corresponding one of said first plurality of holes;
   probing means disposed partly within said first plurality of holes in said probe plate, and partly intermediate the card and said probe plate, in substantial alignment with corresponding ones of the ends of the electronic devices, for selectively establishing electrical contact therewith during the test;
   interconnecting means connected to said probe plate, and engaging said second plurality of holes on said probe plate, adjacent said probing means, in substantial alignment with corresponding ones of the contacts, for establishing electrical connection therewith;
   said interconnecting means further engaging said third plurality of holes on said probe plate, when said corresponding adjacent ones of said probing means are in substantial alignment with the oppositely positioned contacts on the test system interface;
   electrical conducting means, connected between said generally adjacent probing means and interconnecting means, for providing a continuous electrical path therebetween;
   said electrical conducting means being physically dimensioned to offset the separation between said probing means and said interconnecting means, for causing the ends of the electronic devices to be matched with, and electrically connected to corresponding ones of the contacts of the test system interface; and
   actuating means for moving the card relative to said probe plate, for causing the ends of the electronic devices on the card to contact said probing means, in order to establish a continuous electrical path between the electronic devices and the test system interface.

2. A fixture as in claim 1 wherein the actuating means withdraws air from a vacuum chamber formed by the card and probe plate to hold the card against the probing means.

3. The fixture as defined in claim 1, further including alignment means, which is spaced-apart from said probe plate, and which is disposed generally adjacent the test system interface, for retaining said interconnecting means in electrical connection with contacts on the test system interface.

4. The fixture as defined in claim 3, wherein said alignment means includes means for focusing the interconnecting means into the contacts of the test system interface.

5. The fixture as defined in claim 4, wherein said alignment means includes a substantially flat plate, and wherein said focusing means includes a plurality of spaced-apart outwardly tapered bores, for providing sufficient clearance space to enable said itnerconnecting means which engage said third plurality of holes to deform in order to offset the axial separation between said third plurality of holes and the contacts.

6. The fixture as defined in claim 1, wherein each one of said probing means includes an elongated probe socket, which is generally hollow throughout substantially its entire axial length; and wherein said probe socket partially engages a corresponding one of said first plurality of holes.

7. The fixture as defined in claim 6, wherein each one of said probing means further includes a probe tip which is connected to one end of said probe socket, intermediate the card and said probe plate, for contacting one end of the electronic devices.

8. The fixture as defined in claim 7, wherein each one of said interconnecting means includes an elongated pin for engaging a corresponding one of said second and third plurality of holes.

9. The fixture as defined in claim 1, wherein the contact of the test system interface are disposed on a fixed grid.

10. The fixture as defined in claim 3, further including means for positioning said alignment means at a substantially fixed distance from said probe plate.

11. The fixture as defined in claim 10, further including at least a pair of spaced-apart positioning pins, disposed intermediate the card and said probe plate, for retaining them at an adjustable distance from one another.

12. A method for connecting a board test fixture between a card having electronic devices mounted thereon at fixed predetermined locations, and a test system interface having electrical contacts at fixed predetermined locations, the electronic devices including ends to be matched with, and electrically connected to the contacts, regardless of the disposition or alignment of the contacts relative to the ends of the electronic devices to be tested, the method comprising the steps of:

disposing a perforate probe plate intermediate the card and the test system interface, said probe plate having a first plurality of spaced-apart holes at fixed predetermined locations thereon, wherein said first plurality of holes are aligned in substantial registration with the ends of the electronic device on the card;

wherein said probe plate further includes a second plurality of spaced-apart holes at fixed predetermined locations thereon, and wherein said second plurality of holes are aligned in substantial registration with the electrical contacts of the test system interface;

wherein said probe plate additionally includes a third plurality of spaced-apart holes at fixed predetermined locations thereon, wherein said third plurality of holes are axially offset relative to the electrical contacts of the test system interface, and wherein each one of said second and third plurality of hole is generally disposed adjacent to, and substantially grouped with a corresponding one of said first plurality of holes;

disposing probing means partly within said first plurality of holes in said probe plate, and partly intermediate the card and said probe plate in substantial alignment with corresponding ones of the ends of the electronic devices, for selectively establishing electrical contact therewith during the test;

connecting interconnecting means to said probe plate;

engaging said interconnecting means to said second plurality of holes on said probe plate, adjacent said probing means, in substantial alignment with corresponding ones of the contacts, for establishing electrical connection therewith;

engaging said interconnecting means to said third plurality of holes on said probe plate, when said corresponding adjacent ones of said probing means are in substantial alignment with the oppositely positioned contacts on the test system interface;

connecting electrical conducting means between said generally adjacent probing means and interconnecting means, for providing a continuous electrical path therebetween; and actuating the card relative to said probe plate, for causing the ends of the electronic devices on the card to contact said probing means, to establish a continuous electrical path between the electronic devices and the test system interface.

13. The method as defined in claim 12, wherein said step of actuating includes creating a vacuum between said probe plate and the card, for causing said probing means to come in contact with the ends of the electronic devices.

14. The method as defined in claim 13, further including the step of positioning said probe plate at a generally fixed distance from an alignment plate which is disposed adjacent to the test interface system.

15. The method as defined in claim 14, further including the step of aligning the card relative to said probe plate, by means of at least a pair of positioning pins.

* * * * *